US010833210B2

(12) United States Patent
Kwon et al.

(10) Patent No.: US 10,833,210 B2
(45) Date of Patent: Nov. 10, 2020

(54) SOLAR CELL AND METHOD FOR MANUFACTURING THE SAME

(71) Applicant: LG ELECTRONICS INC., Seoul (KR)

(72) Inventors: Hyungjin Kwon, Seoul (KR);
Hyunjung Park, Seoul (KR);
Junghoon Choi, Seoul (KR); Changseo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/323,986

(22) Filed: Jul. 3, 2014

(65) Prior Publication Data
US 2015/0007879 A1 Jan. 8, 2015

(30) Foreign Application Priority Data

Jul. 5, 2013 (KR) .................. 10-2013-0079184

(51) Int. Cl.
*H01L 31/0224* (2006.01)
*H01L 31/18* (2006.01)
(Continued)

(52) U.S. Cl.
CPC .... *H01L 31/022441* (2013.01); *H01L 31/028* (2013.01); *H01L 31/0682* (2013.01);
(Continued)

(58) Field of Classification Search
CPC ......... H01L 31/0682; H01L 31/022441; H01L 31/022458; H01L 31/028;
(Continued)

(56) References Cited

U.S. PATENT DOCUMENTS 5,322,572 A  6/1994 Wanlass
7,468,485 B1 * 12/2008 Swanson ........... H01L 31/03682
136/243

(Continued)

FOREIGN PATENT DOCUMENTS

CN   102239572 A   11/2011
EP   2202807 A2    6/2010
(Continued)

OTHER PUBLICATIONS

Kluska, et al. "Modeling and optimization study of industrial n-type high-efficiency back-contact back-junction silicon solar cells." Solar Energy Materials and Solar Cells 94.3 (2010): 568-577.*

(Continued)

*Primary Examiner* — William E McClain
(74) *Attorney, Agent, or Firm* — Birch, Stewart, Kolasch & Birch, LLP

(57) ABSTRACT

Discussed is a solar cell including a semiconductor substrate, a tunneling layer formed on one surface of the semiconductor substrate, a first conductive semiconductor layer formed on a surface of the tunneling layer and a second conductive semiconductor layer formed on the surface the tunneling layer. A separation portion separates the first and second conductive semiconductor layers from each other, and is formed on the surface of the tunneling layer at a location corresponding to at least a portion of a boundary between the first and second conductive semiconductor layers.

11 Claims, 13 Drawing Sheets

(51) Int. Cl.
H01L 31/068 (2012.01)
H01L 31/028 (2006.01)

(52) U.S. Cl.
CPC ........ H01L 31/182 (2013.01); H01L 31/1804 (2013.01); H01L 31/1824 (2013.01); *Y02E 10/547* (2013.01); *Y02P 70/521* (2015.11)

(58) Field of Classification Search
CPC ..... H01L 31/022425; H01L 31/022433; H01L 31/1804; H01L 31/182; H01L 31/1824
See application file for complete search history.

(56) References Cited

U.S. PATENT DOCUMENTS

| | | | |
|---|---|---|---|
| 7,633,006 B1* | 12/2009 | Swanson | H01L 31/03682 136/243 |
| 7,812,250 B2 | 10/2010 | Smith | |
| 2006/0130891 A1* | 6/2006 | Carlson | H01L 31/02168 136/256 |
| 2009/0223562 A1 | 9/2009 | Niira et al. | |
| 2009/0293948 A1 | 12/2009 | Tucci et al. | |
| 2009/0308438 A1 | 12/2009 | De Ceuster et al. | |
| 2009/0314341 A1* | 12/2009 | Borden | H01L 31/022441 136/256 |
| 2010/0139764 A1 | 6/2010 | Smith | |
| 2010/0154869 A1 | 6/2010 | Oh et al. | |
| 2010/0193027 A1 | 8/2010 | Ji et al. | |
| 2010/0197144 A1 | 8/2010 | Dove et al. | |
| 2010/0229928 A1* | 9/2010 | Zuniga | H01L 31/1804 136/255 |
| 2011/0023956 A1* | 2/2011 | Harder | H01L 31/022441 136/256 |
| 2011/0126898 A1* | 6/2011 | Harley | H01L 31/0682 136/256 |
| 2012/0199183 A1 | 8/2012 | Oh et al. | |
| 2012/0247560 A1 | 10/2012 | Rim et al. | |
| 2012/0322199 A1 | 12/2012 | Graff | |
| 2013/0112253 A1 | 5/2013 | Oh et al. | |
| 2013/0139876 A1 | 6/2013 | Shigematsu et al. | |
| 2013/0160847 A1* | 6/2013 | Murakami | H01L 31/022433 136/256 |
| 2014/0170800 A1* | 6/2014 | Loscutoff | H01L 31/18 438/72 |
| 2014/0174515 A1* | 6/2014 | Molesa | H01L 31/0352 136/255 |

FOREIGN PATENT DOCUMENTS

| | | |
|---|---|---|
| JP | 5-114747 A | 5/1993 |
| JP | 2003-298078 A | 10/2003 |
| JP | 2011-523230 A | 8/2011 |
| JP | 2011-523231 A | 8/2011 |
| JP | 2012-517121 A | 7/2012 |
| JP | 2012-164961 A | 8/2012 |
| JP | 2013-77851 A | 4/2013 |
| JP | 2013-120863 A | 6/2013 |
| KR | 10-2010-0089538 A | 8/2010 |
| KR | 10-2013-0050721 A | 5/2013 |
| WO | WO 03/083955 A1 | 10/2003 |

OTHER PUBLICATIONS

Galbiati, et al. "Results on n-type IBC solar cells using industrial optimized techniques in the fabrication processing." Energy Procedia 8 (2011): 421-426.*

Lu, et al. "Optimization of interdigitated back contact silicon heterojunction solar cells: tailoring hetero-interface band structures while maintaining surface passivation." Progress in Photovoltaics: Research and Applications 19.3 (2011): 326-338.*

Renshaw, et al. "Device optimization for screen printed interdigitated back contact solar cells." Photovoltaic Specialists Conference (PVCS), 2011 37th IEEE. IEEE, 2011.*

Lu et al. "Interdigitated Back Contact Silicon Heterojunction Solar Cell and the Effect of Front Surface Passivation," Applied Physics Letters, vol. 91, No. 6, Jan. 1, 2007, 4 pages.

* cited by examiner

SOLAR CELL AND METHOD FOR MANUFACTURING THE SAME

CROSS-REFERENCE TO RELATED APPLICATION

This application claims the priority benefit of Korean Patent Application No. 10-2013-0079184, filed on Jul. 5, 2013 in the Korean Intellectual Property Office, the disclosure of which is incorporated herein by reference.

BACKGROUND OF THE INVENTION

1. Field of the Invention

Embodiments of the invention relate to a solar cell and a method for manufacturing the same and, more particularly, to a solar cell having a back surface electrode structure and a method for manufacturing the same.

2. Description of the Related Art

Recently, due to a depletion of existing energy resources, such as oil and coal, interest in alternative sources of energy to replace the existing energy resources is increasing. Most of all, solar cells are popular next generation cells to convert sunlight into electrical energy.

Solar cells may be fabricated via formation of various layers and electrodes based on designs. The designs of various layers and electrodes may determine the efficiency of solar cells. The most important requirement for commercialization of solar cells is to overcome the low efficiency of solar cells and to design various layers and electrodes so as to maximize the efficiency of solar cells. In addition, it is necessary to simplify a method for manufacturing a solar cell having various layers and electrodes.

SUMMARY OF THE INVENTION

Therefore, the embodiments of the invention have been made in view of the above issues, and it is an object of the embodiments of the invention to provide a solar cell having excellent properties and high productivity and a method for manufacturing the same.

In accordance with one embodiment of the invention, the above and other objects can be accomplished by the provision of a solar cell including a semiconductor substrate, a tunneling layer formed on one surface of the semiconductor substrate, a first conductive semiconductor layer formed on a surface of the tunneling layer, a second conductive semiconductor layer formed on the surface of the tunneling layer, and a separation portion to separate the first and second conductive semiconductor layers from each other, and is formed on the surface of the tunneling layer at a location corresponding to at least a portion of a boundary between the first and second conductive semiconductor layers.

In accordance with another embodiment of the invention, there is provided a method for manufacturing a solar cell, the method including forming a tunneling layer on one surface of a semiconductor substrate, forming a first conductive semiconductor layer and a second conductive semiconductor layer on a surface of the tunneling layer, the first and second conductive semiconductor layers coming into contact with each other and forming a trench in at least a portion of a boundary between the first and second conductive semiconductor layers by selectively removing portions of the first and second conductive semiconductor layers on the tunneling layer.

In accordance with a further embodiment of the invention, there is provided a method for manufacturing a solar cell, the method including preparing a semiconductor substrate, forming a tunneling layer on one surface of the semiconductor substrate, forming an intrinsic semiconductor layer on a surface of the tunneling layer and doping the intrinsic semiconductor layer with a first conductive dopant and a second conductive dopant to form a first conductive semiconductor layer and a second conductive semiconductor layer, respectively, wherein, in the doping, a boundary between the first conductive semiconductor layer and the second conductive semiconductor layer is partially undoped to form a separation portion.

BRIEF DESCRIPTION OF THE DRAWINGS

The above and other objects, features and other advantages of the embodiments of the invention will be more clearly understood from the following detailed description taken in conjunction with the accompanying drawings, in which.

DETAILED DESCRIPTION OF THE EMBODIMENTS

Figure 1:
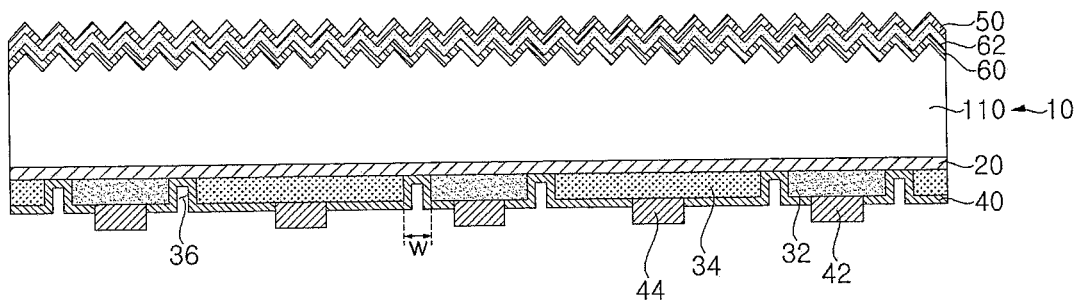
FIG. 1 is a sectional view showing a solar cell according to one embodiment of the invention.

Reference will now be made in detail to the embodiments of the invention, examples of which are illustrated in the accompanying drawings. However, it will be understood that the embodiments of the invention should not be limited to the embodiments and may be modified in various ways.

In the drawings, to clearly and briefly explain the embodiments of the invention, illustration of elements having no connection with the description is omitted, and the same or extremely similar elements are designated by the same reference numerals throughout the specification. In addition, in the drawings, for a more clear explanation, the dimensions of elements, such as thickness, width, and the like, are exaggerated or reduced, and thus the thickness, width, and the like of the embodiments of the invention are not limited to the illustration of the drawings.

In the entire specification, when an element is referred to as "including" another element, the element should not be understood as excluding other elements so long as there is no specific conflicting description, and the element may include at least one other element. In addition, it will be understood that, when an element such as a layer, film, region or substrate is referred to as being "on" another element, it can be directly on the other element or intervening elements may also be present. On the other hand, when an element such as a layer, film, region or substrate is referred to as being "directly on" another element, this means that there are no intervening elements therebetween.

Hereinafter, a solar cell and a method for manufacturing the same according to the embodiments of the invention will be described in detail with reference to the accompanying drawings.

FIG. 1 is a sectional view showing a solar cell according to one embodiment of the invention.

Referring to FIG. 1, the solar cell 100 according to the embodiment of the invention includes a semiconductor substrate 10, a tunneling layer 20 formed on one surface (e.g., a back surface) of the semiconductor substrate 10, and a first conductive semiconductor layer and a second conductive semiconductor layer 34 which are formed on the tunneling layer 20. The solar cell 100 may further include first and second electrodes 42 and 44 connected to the first and second conductive semiconductor layers 32 and 34, the first and second electrodes 42 and serving to collect carriers. In addition, the solar cell 100 may further include a passivation film 60, a front surface field layer 62 and an anti-reflection film 50, for example. This will be described below in more detail.

The semiconductor substrate 10 may include a base region 110 containing a first conductive dopant, the first conductive dopant being doped at a low density. In this instance, the base region 110, for example, may be formed of silicon containing the first conductive dopant. The silicon may be single-crystal silicon and the first conductive dopant may be an n-type dopant or a p-type dopant. That is, the first conductive dopant may be an n-type dopant including a group-V element, such as phosphorous (P), arsenic (As), bismuth (Bi), antimony (Sb) or the like. Alternatively, the first conductive dopant may be a p-type dopant including a group-III element, such as boron (B), aluminum (Al), gallium (Ga), indium (In) or the like.

In the embodiment of the invention, the semiconductor substrate 10 includes the base region 110 without an additional doping region. This may prevent damage to the semiconductor substrate 10 due to formation of the doping region and also prevent recombination in the doping region.

In one example, the base region 110 may contain an n-type dopant as the first conductive dopant. Hence, the second conductive semiconductor layer 34, which forms tunnel junctions with the semiconductor substrate 10 (more particularly, the base region 110) through the tunneling layer 20, may be a p-type layer. Thereby, the second conductive semiconductor layer 34 may be formed over a wide area and serve as an emitter to cause photoelectric conversion by the junctions between the second conductive semiconductor layer 34 and the semiconductor substrate 10, which may ensure effective collection of holes having less mobility than electrons. When light is emitted to the above-described tunnel junctions, electrons generated by the photoelectric effect are collected by the first electrode 42 and holes move to a front surface of the semiconductor substrate 10 and are collected by the second electrode 44. Thereby, electric energy is generated. However, the embodiments of the invention are not limited thereto and the semiconductor substrate 10 and the first conductive semiconductor layer 32 may be a p-type and the second conductive semiconductor layer 34 may be an n-type.

The front surface of the semiconductor substrate 10 may be subjected to texturing and, thus, have convex and concave portions (e.g., pyramidal portions or other shaped portions). The textured front surface of the semiconductor substrate 10, provided with the convex and concave portions, may attain increased surface roughness, which may reduce reflectance of light incident upon the front surface of the semiconductor substrate 10. In this way, the quantity of light reaching the tunnel junctions formed by the semiconductor substrate 10 and the second conductive semiconductor layer 34 may be increased, which may minimize light loss.

The back surface of the semiconductor substrate 10 may be subjected to polishing, for example, and may be a relatively smooth and flat surface having less surface roughness than the front surface of the semiconductor substrate 10. As such, light having passed through the semiconductor substrate 10 to the back surface may be reflected by the back surface and then again progress into the semiconductor substrate 10. In addition, in the instance in which the tunnel junctions are formed through the tunneling layer 20 at the back surface of the semiconductor substrate 10 as in the embodiment of the invention, properties of the solar cell 100 may be greatly changed according to properties of the back surface of the semiconductor substrate 10. For this reason, the back surface of the semiconductor substrate 10 is not provided with convex and concave portions by texturing. However, the embodiments of the invention are not limited thereto and various alterations are possible.

The passivation film 60, the front surface field layer 62 and the anti-reflection film 50 may be formed on the front surface of the semiconductor substrate 10 (i.e. over the semiconductor substrate 10) in sequence. The passivation film 60, the front surface field layer 62 and the anti-reflection film 50 may be formed on the entire front surface. This may maximize effects of the respective layers and simplify a manufacturing process thereof because patterning is unnecessary.

The passivation film 60 basically serves to passivate defects present in the surface or bulk of the semiconductor substrate 10. The front surface field layer 62 has a function similar to that of a Back Surface Field (BSF) layer because a first or second conductive dopant thereof has a greater density than that of the semiconductor substrate 10. That is, the front surface field layer 62 creates an electric field to prevent recombination of carriers at the front surface of the semiconductor substrate 10. This may increase an open-circuit voltage Voc of the solar cell 100. The anti-reflection film 50 may serve to lower a reflectance of light incident upon the front surface of the semiconductor substrate 10, thereby increasing the quantity of light reaching the tunnel junctions. This may increase a short-circuit current Isc of the solar cell 100.

In one example, the passivation film 60 and/or the anti-reflection film 50 may have a single-layer film structure of any one selected from the group consisting of a silicon nitride film, a silicon nitride film containing hydrogen, a silicon oxide film, a silicon oxide nitride film, $MgF_2$, ZnS, $TiO_2$, and $CeO_2$, or a multi-layer film structure of at least two of the aforementioned material films. Alternatively, the passivation film 60 may be formed of an intrinsic amorphous semiconductor (for example, amorphous silicon), for example.

In one example, the front surface field layer 62 may be formed of an amorphous semiconductor (for example, amorphous silicon) doped with a first or second conductive dopant. However, the embodiments of the invention are not limited thereto and the front surface field layer 62 may be omitted when the passivation film 60, the anti-reflection film 50 and the like have a sufficient fixed charge.

That is, the passivation film 60, the front surface field layer 62 and the anti-reflection film 50 may be formed of various other materials other than the aforementioned materials. In addition, the terms "passivation film", "front surface field layer" and "anti-reflection film" are merely used for convenience and the embodiments of the invention are not limited thereto. That is, a single layer may perform at least two of passivation, electric field creation and anti-reflection. For example, the anti-reflection film 50 may have a fixed charge to perform electric field creation and also have an anti-reflection property. In this instance, the front surface field layer 62 may be omitted. In addition, the formation sequence of the passivation film 60, the front surface field layer 62 and the anti-reflection film 50 may be changed in various ways. In one example, in the embodiment of the invention, the front surface field layer 62 is disposed on the passivation film 60 separately from the semiconductor substrate 10. In another example, the front surface field layer 62 may be formed by doping the semiconductor substrate 10 with a first conductive dopant at a greater density than that of the semiconductor substrate 10. In this instance, the passivation film 60 and/or the anti-reflection film 50 are disposed above the front surface field layer 62. Various other alterations are also possible.

The tunneling layer 20 is formed on the back surface of the semiconductor substrate 10. The tunneling layer 20 may improve interface properties of the back surface of the semiconductor substrate 10 and perform an effective transfer of produced carriers via tunneling. The tunneling layer 20 may be formed of various materials to enable the carrier tunneling. For example, the tunneling layer 20 may be formed of an oxide, a nitride, a conductive polymer and the like. In this instance, the tunneling layer 20 may be formed on the entire back surface of the semiconductor substrate 10. Accordingly, the tunneling layer 20 may passivate the entire back surface of the semiconductor substrate 10 and may be easily formed without patterning.

To achieve a sufficient tunneling effect, a thickness of the tunneling layer 20 may be 5 nm or less and may be within a range of 0.5 nm to 5 nm (for example, within a range of 1 nm to 4 nm). When a thickness of the tunneling layer 20 exceeds 5 nm, tunneling may be insufficient for operation of the solar cell 100. When a thickness of the tunneling layer 20 is below 5 nm, it may be difficult to form a desired quality of the tunneling layer 20. To further enhance the tunneling effect, a thickness of the tunneling layer 20 may be within a range of 1 nm to 4 nm. However, the embodiments of the invention are not limited thereto and a thickness of the tunneling layer 20 may be changed.

The first conductive semiconductor layer 32 may be formed of a semiconductor (for example, silicon) containing the same first conductive dopant as the semiconductor substrate 10. The first conductive dopant may be any dopant of the same conductivity type as the semiconductor substrate 10. That is, when the first conductive dopant is an n-type dopant, a group-V element, such as phosphorous (P), arsenic (As), bismuth (Bi), antimony (Sb) or the like, may be used. When the first conductive dopant is a p-type dopant, a group-III element, such as boron (B), aluminum (Al), gallium (Ga), Indium (In) or the like, may be used. The first conductive semiconductor layer 32 may have a back surface field structure and serve to prevent loss of carriers due to recombination at the surface of the semiconductor substrate 10. In addition, the first conductive semiconductor layer 32 may serve to reduce a contact resistance at a portion thereof coming into contact with the first electrode 42.

The second conductive semiconductor layer 34 may be formed of a semiconductor (for example, silicon) containing a second conductive dopant opposite to that of the semiconductor substrate 10. In this instance, the second conductive dopant is any dopant of a conductivity type opposite to that of the semiconductor substrate 10. That is, when the second conductive dopant is a p-type dopant, a group-III element, such as boron (B), aluminum (Al), gallium (Ga), Indium (In) or the like, may be used. When the second conductive dopant is an n-type dopant, a group-V element, such as phosphorous (P), arsenic (As), bismuth (Bi), antimony (Sb) or the like, may be used. The second conductive semiconductor layer 34 forms tunnel junctions with the semiconductor substrate 10 through the tunneling layer 20, thereby substantially contributing to photoelectric conversion.

The first and second conductive semiconductor layers 32 and 34 have an even thickness and are disposed on the same plane. As such, when viewed in plane, the first and second conductive semiconductor layers 32 and 34 are formed so as not to overlap each other. This eliminates a need to form an insulation layer between the first and second conductive semiconductor layers 32 and 34 in the form of a stack. This non-overlapping structure is possible because the first and second conductive semiconductor layers 32 and 34 are formed by doping a single semiconductor layer 30 with different first and second conductive dopants. In this way, it is possible to simplify a configuration and a manufacturing method of the solar cell 100 and to reduce a thickness of the solar cell 100 via omission of an unnecessary insulation layer.

In this instance, the second conductive semiconductor layer 34, which has a different conductivity type from the semiconductor substrate 10, may have a greater area than an area of the first conductive semiconductor layer 32 which has the same conductivity type as the semiconductor substrate 10. As such, the tunnel junctions formed through the tunneling layer 20 between the semiconductor substrate 10 and the second conductive semiconductor layer 34 may have a greater area. In addition, as described above, in the instance in which the semiconductor substrate 10 and the first conductive semiconductor layer 32 are of the same conductivity type, i.e. an n-type and the second conductive semiconductor layer 34 is a p-type, effective collection of holes having less mobility is possible. The above-described planar structure of the first and second conductive semiconductor layers 32 and 34 will be described below in more detail with reference to FIG. 2.

An insulation layer 40 may be formed over the first and second conductive semiconductor layers 32 and 34. The insulation layer 40 may serve to prevent the first and second conductive semiconductor layers 32 and 34 from being connected to electrodes that they should not be connected (i.e. to prevent the first conductive semiconductor layer 32 from being connected to the second electrode 44 and to prevent the second conductive semiconductor layer 34 from being connected to the first electrode 42). In addition, the insulation layer 40 may serve to passivate the first and second conductive semiconductor layers 32 and 34.

The insulation layer 40 may be thicker than the tunneling layer 20. This may improve insulation and passivation properties. The insulation layer 40 may be formed of various insulation materials (for example, oxides and nitrides). In one example, the insulation layer may have a single-layer film structure of any one selected from the group consisting of a silicon nitride film, a silicon nitride film containing hydrogen, a silicon oxide film, a silicon oxide nitride film, $Al_2O_3$, $MgF_2$, ZnS, $TiO_2$, and $CeO_2$, or a multi-layer film structure of at least two of the aforementioned material films. However, the embodiments of the invention are not limited thereto and the insulation layer 40 may be formed of various other materials. In addition, the insulation layer 40 may be omitted.

The insulation layer 40 has a first opening, through which the first conductive semiconductor layer 32 is exposed, and a second opening through which the second conductive semiconductor layer 34 is exposed.

The first electrode 42 is connected to the first conductive semiconductor layer 32 through the first opening and the second electrode 44 is connected to the second conductive semiconductor layer 34 through the second opening. The first and second electrodes 42 and 44 may be formed of various metals. In addition, the first and second electrodes 42 and 44 may have various planar shapes such that the first and second electrodes 42 and 44 are not electrically connected to each other and are connected respectively to the first and second conductive semiconductor layers 32 and 34 to collect produced carriers and to transfer the same to the outside. That is, the embodiments of the invention are not limited to the above-described planar shapes of the first and second electrodes 42 and 44.

In the embodiment of the invention, a separation portion to separate the first conductive semiconductor layer 32 and the second conductive semiconductor layer 34 from each other may be formed at a boundary between the first conductive semiconductor layer 32 and the second conductive semiconductor layer 34. In one example, the embodiment of the invention illustrates a trench 36 as the separation portion. The trench 36 serves as a spacer between the first conductive semiconductor layer 32 and the second conductive semiconductor layer 34, thereby preventing local heat emission (for example, hot spots) that may occur when the first and second conductive semiconductor layers 32 and 34 come into contact with each other. This may enhance electrical reliability, resulting in remarkably enhanced reliability of the solar cell 100 in terms of long-term use.

In this instance, the trench 36 may be formed by removing a boundary portion between the first conductive semiconductor layer 32 and the second conductive semiconductor layer 34. In the embodiment of the invention, the trench 36 is formed only in the first conductive semiconductor layer 32 and the second conductive semiconductor layer 34 over the tunneling layer 20 and is not formed in the tunneling layer 20 and the semiconductor substrate 10. As such, the tunneling layer is formed on the entire back surface of the semiconductor substrate 10 including a location corresponding to the trench 36 formed in the boundary between the first and second conductive semiconductor layers 32 and 34. This may prevent damage to the tunneling layer 20 and, consequently, damage to the semiconductor substrate 10 due to formation of the trench 36. In this way, the open-circuit voltage and current density of the solar cell 100 may be enhanced by minimizing damage to the semiconductor substrate 10 and the tunneling layer 20. In addition, an additional passivation layer for passivation of the semiconductor substrate 10 and the tunneling layer 20 is not necessary, which may result in a simplified manufacturing process. That is, assuming that a trench is formed in the semiconductor substrate and the tunneling layer differently from that in the embodiment of the invention, damage to the semiconductor substrate and the tunneling layer may occur. Therefore, there is a need to form an additional passivation layer for passivation at the trench. On the other hand, in the embodiment of the invention, since the trench 36 is not formed in the semiconductor substrate 10 and the tunneling layer 20, there occurs no damage to the semiconductor substrate 10 and the tunneling layer 20 and an additional passivation layer is not necessary.

In this instance, since the trench 36 serves as a spacer between the first conductive semiconductor layer 32 and the second conductive semiconductor layer 34, the trench 36 may have a minimum width required to cause the first conductive semiconductor layer 32 and the second conductive semiconductor layer 34 to be spaced apart from each other. That is, the trench 36 may have a smaller width than a width of the first conductive semiconductor layer 32 that has a relatively small area.

In this instance, a width W of the trench 36 may be within a range of 0.5 µm to 100 µm. When the width W of the trench 36 is below 0.5 µm, electrical insulation between the first and second conductive semiconductor layers 32 and 34 may be insufficient. When the width W of the trench exceeds 100 µm, a region having a low level of contribution to photo-electric conversion (i.e. a region corresponding to the trench 36) is increased, which may deteriorate efficiency of the solar cell 100. In terms of insulation effect and efficiency of the solar cell 100, the width W of the trench 36 may be within a range of 1 µm to 30 µm. However, the embodiments of the invention are not limited thereto and the width W of the trench 36 may be changed in various ways.

In this instance, when viewed in plane, the trench 36 may be formed throughout the boundary between the first and second conductive semiconductor layers 32 and 34. This will be described below in detail with reference to FIG. 2.

Figure 2:
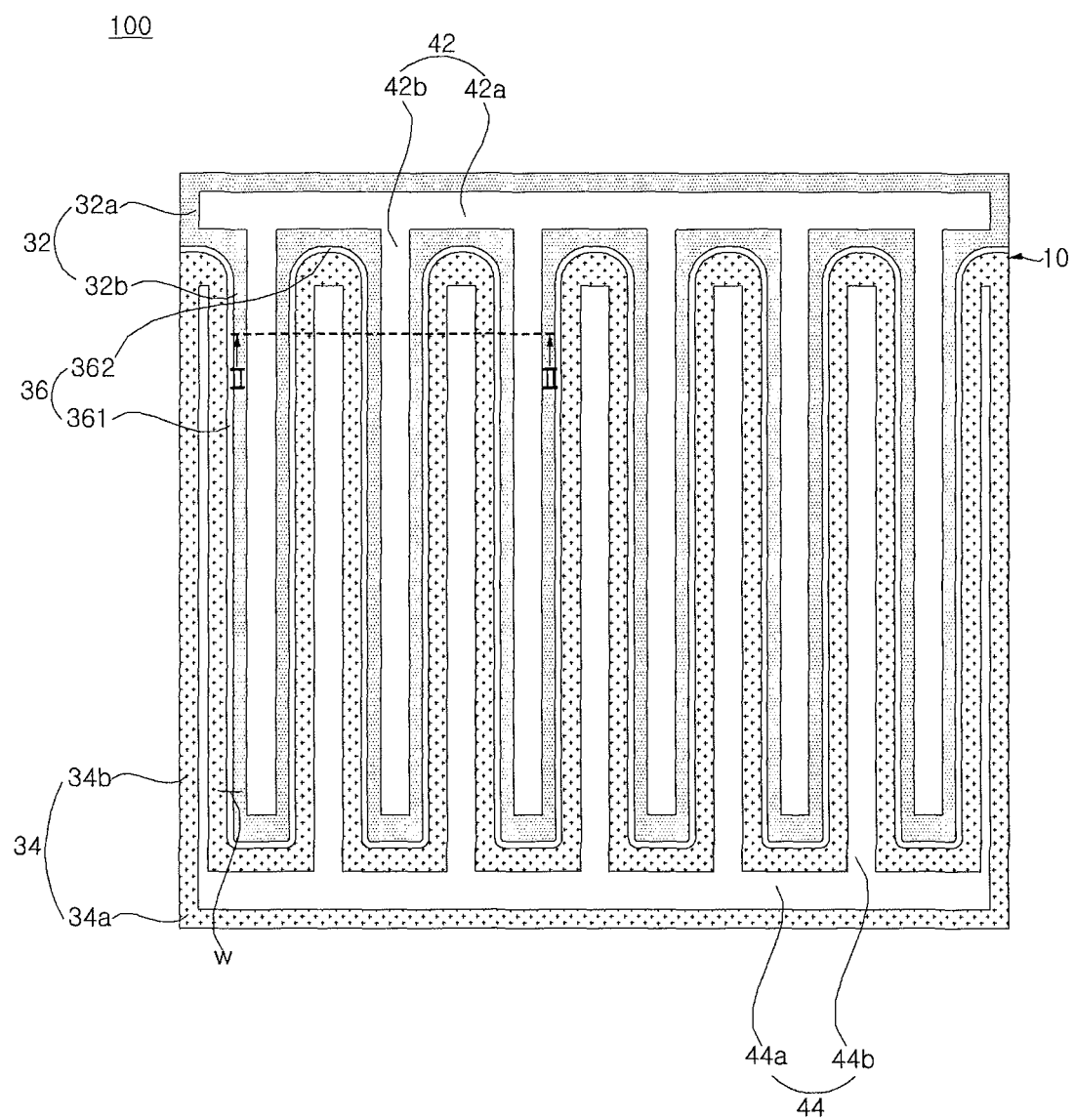
FIG. 2 is a rear plan view showing the solar cell according to the embodiment of the invention.

FIG. 2 is a rear plan view showing the solar cell 100 according to the embodiment of the invention. Shapes of the first and second conductive semiconductor layers 32 and 34 and the first and second electrodes 42 and 44 shown in FIG. 2 are merely given by way of example and the embodiments of the invention are not limited thereto. For clear and brief illustration, the insulation layer 40 is not shown in FIG. 2.

Referring to FIG. 2, in the solar cell 100 according to the embodiment of the invention, the first conductive semiconductor layer 32 has a smaller area than an area of the second conductive semiconductor layer 34. As such, tunnel junctions formed between the semiconductor substrate 10 and the second conductive semiconductor layer 34 through the tunneling layer 20 may have an increased width. In addition, as described above, in the instance in which the semiconductor substrate 10 and the first conductive semiconductor layer 32 are of the same conductivity type, i.e. an n-type and the second conductive semiconductor layer 34 is a p-type, effective collection of holes having less mobility is possible.

The first conductive semiconductor layer 32 may include a first stem portion 32a formed along a first edge of the semiconductor substrate 10 (i.e. an upper edge of the drawing) and a plurality of first branch portions 32b extending from the first stem portion 32a toward a second edge opposite to the first edge (i.e. a lower edge of the drawing). The second conductive semiconductor layer 34 may include a second stem portion 34a formed along the second edge of the semiconductor substrate 10 and a plurality of second branch portions 34b extending from the second stem portion 34a toward the first edge, each second branch portion 34b being located between the two neighboring first branch portions 32b. The first branch portions 32b of the first conductive semiconductor layer 32 and the second branch portions 34b of the second conductive semiconductor layer 34 may be alternately arranged, such as being interdigitated. In addition, the tunneling layer 20 may have a shape equal to or substantially similar to the first conductive semiconductor layer 34 and, thus, may have portions corresponding to the second stem portion 34a and the second branch portions 34b.

In this instance, areas of the first conductive semiconductor layer 32 and the second conductive semiconductor layer 34 may be adjusted by providing the first and second stem portions 32a and 34a and/or the first and second branch portions 32b and 34b with different widths. That is, a width of the first stem portion 32a may be less than a width of the second stem portion 34a, and/or a width of the first branch portions 32b may be less than a width of the second branch portions 34b.

In addition, as described above, the trench 36 is formed throughout the boundary between the first conductive semiconductor layer 32 and the second conductive semiconductor layer 34. In this instance, the trench 36 is located between the plural first branch portions 32b of the first conductive semiconductor layer 32 and the plural second branch portions 34b of the second conductive semiconductor layer 34. As such, the trench 36 may generally have an elongated zigzag or serpentine planar shape. More specifically, the trench 36 may include first trench portions 361 longitudinally located between the plural first branch portions 32b of the first conductive semiconductor layer 32 and the plural second branch portions 34b of the second conductive semiconductor layer 34, and second trench portions 362 formed in a direction crossing the first trench portions 361 to interconnect the two neighboring first trench portions 361. In this instance, the second trench portions 362 alternately interconnect one side and the other side of the respective first trench portions 361. This may fundamentally prevent hot spots by preventing contact between the first and second conductive semiconductor layers 32 and 34.

The first electrode 42 may include a stem portion 42a formed to correspond to the first stem portion 32a of the first conductive semiconductor layer 32 and branch portions 42b formed to correspond to the first branch portions 32b of the first conductive semiconductor layer 32. Similarly, the second electrode 44 may include a stem portion 44a formed to correspond to the second stem portion 34a of the second conductive semiconductor layer and branch portions 44b formed to correspond to the second branch portions 34b of the second conductive semiconductor layer 34. However, the embodiments of the invention are not limited thereto and the first electrode and the second electrode 44 may have various other planar shapes.

Through the above-described configuration, the first electrode 42 is formed on the first conductive semiconductor layer 32 so as to wholly come into contact with the same and the second electrode 44 is formed on the second conductive semiconductor layer 34 so as to wholly come into contact with the same. As such, the first conductive semiconductor layer 32 and the first electrode may be spaced apart from the second conductive semiconductor layer 34 and the second electrode 44 even under the condition that the second conductive semiconductor layer 34 has a sufficient area. This may ensure stable electrical connection between the first conductive semiconductor layer 32 and the first electrode and stable electrical connection between the second conductive semiconductor layer 34 and the second electrode 44.

Provision of the insulation layer 40 may improve passivation and insulation properties, etc. However, the insulation layer 40 is not integral.

A method for manufacturing the solar cell 100 having the above-described configuration will be described below in detail with reference to FIGS. 3A to 3K. Hereinafter, a detailed description related to the parts as already described above will not be repeated and only parts different from those already described will be provided in detail.

FIGS. 3A to 3K are sectional views showing a method for manufacturing the solar cell according to the embodiment of the invention.

Figure 3A:
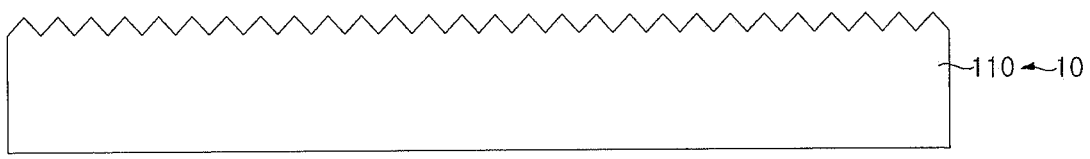
FIGS. 3A to 3K are sectional views showing a method for manufacturing the solar cell according to the embodiment of the invention.

First, as shown by example in FIG. 3A, the semiconductor substrate 10, which includes the base region 110 containing the first conductive dopant, is prepared. In the embodiment of the invention, the semiconductor substrate 10 may be formed of silicon containing an n-type dopant. A group-V element, such as phosphorous (P), arsenic (As), bismuth (Bi), antimony (Sb) or the like, may be used as the n-type dopant.

In this instance, the front surface of the semiconductor substrate 10 is subjected to texturing and, thus, has convex and concave portions and the back surface of the semiconductor substrate 10 is subjected to polishing, for example. Thus, the back surface of the semiconductor substrate 10 may have less surface roughness than the front surface. Texturing at the front surface of the semiconductor substrate 10 may be wet or dry texturing. Wet texturing may be implemented by dipping the semiconductor substrate 10 in a texturing solution. Such wet texturing has an advantage of a short process time. Dry texturing is implemented by cutting the surface of the semiconductor substrate 10 using a diamond drill or laser, for example. Dry texturing may provide an even convex-concave pattern, but may disadvantageously cause a long process time and damage to the semiconductor substrate 10. In addition, texturing of the semiconductor substrate 10 may be implemented by Reactive Ion Etching (RIE). As described above, in the embodiments of the invention, texturing of the semiconductor substrate 10 may be implemented using various methods. Meanwhile, the back surface of the semiconductor substrate 10 may be subjected to a known polishing process.

Figure 3B:
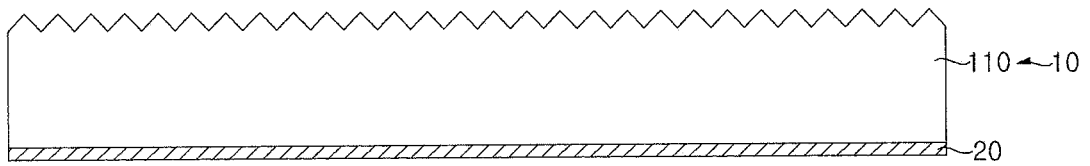

Next, as shown by example in FIG. 3B, the tunneling layer 20 is formed on the back surface of the semiconductor substrate 10. The tunneling layer 20 may be formed by thermal growth, deposition (for example, Plasma Enhanced Chemical Vapor Deposition (PECVD)), or Atomic Layer Deposition (ALD), for example. However, the embodiments of the invention are not limited thereto and the tunneling layer 20 may be formed using various other methods.

Figure 3C:
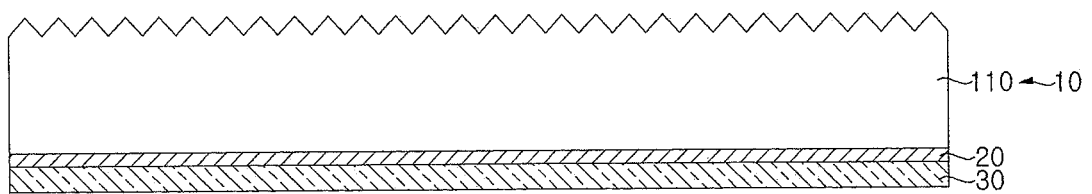

Next, as shown by example in FIG. 3C, the semiconductor layer 30 is formed on the tunneling layer 20. In this instance, the semiconductor layer 30 may be formed of an amorphous, poly-crystal (or poly-crystalline), or fine-crystal (or microcrystalline) semiconductor (for example, silicon).

Next, as shown by example in FIGS. 3D to 3H, the semiconductor layer 30 is doped with first and second conductive dopants to form the first conductive semiconductor layer 32 and the second conductive semiconductor layer 34. This will be described below in more detail.

Figure 3D:
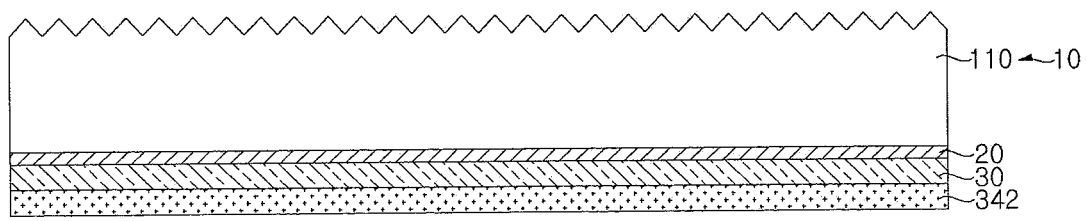

First, as shown by example in FIG. 3D, a doping layer 342 having a second conductive dopant (hereinafter referred to as a second doping layer 342) is formed on the entire semiconductor layer 30. The second doping layer 342 may be any one of various layers having the second conductive dopant and may be formed of Boron Silicate Glass (BSG). When the second doping layer 342 formed of boron silicate glass is formed on the semiconductor layer 30 formed of an amorphous semiconductor, the second doping layer 342 may be formed at a low temperature.

Figure 3E:
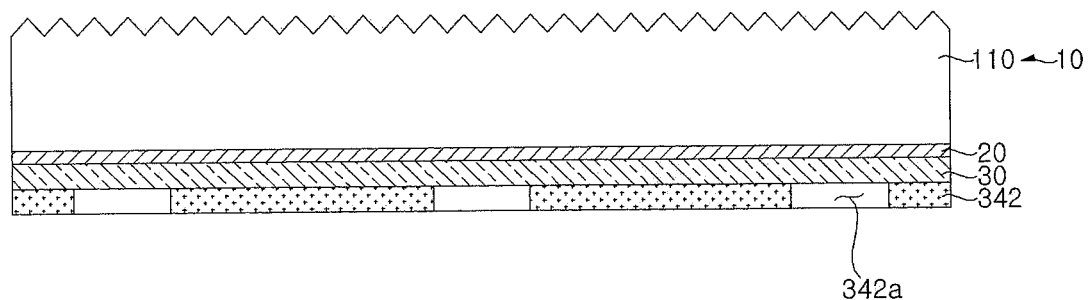

Next, as shown by example in FIG. 3E, a region of the second doping layer 342 corresponding to the first conductive semiconductor layer 32 is selectively etched to form openings 342a. This selective etching may be implemented using various methods. In one example, after a resist layer (for example, used in photolithography), which opens a region where the first conductive semiconductor layer 32 will be formed, is formed on the second doping layer 342, the corresponding region of the second doping layer 342 may be etched using an etching solution. Alternatively, after an etching paste is applied to the second doping layer 342 at a region where the first conductive semiconductor layer 32 will be formed, the corresponding region of the second doping layer 342 may be etched via a thermal treatment.

Figure 3F:
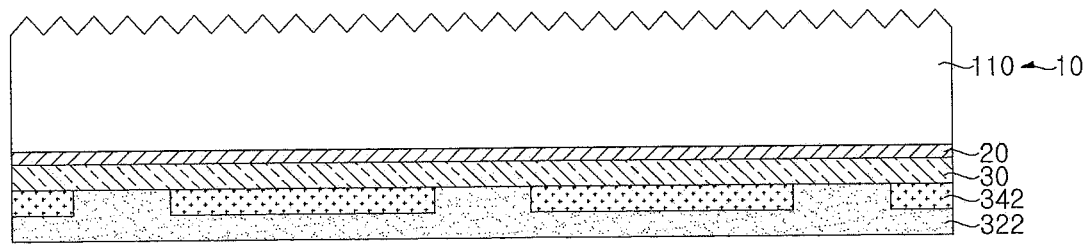

Next, as shown by example in FIG. 3F, a doping layer 322 having a first conductive dopant (hereinafter referred to as a first doping layer 322) is formed on the entire second doping layer 342 such that the openings (see reference numeral 342a of FIG. 3E) are filled with the first doping layer 322. The first doping layer 322 may be any one of various layers having the second conductive dopant and may be formed of Phosphorous Silicate Glass (PSG).

As described above, in the embodiment of the invention, the second doping layer 342 is first formed and, then, the first doping layer 322 is formed. Thereby, as the second doping layer 342, which corresponds to the second conductive semiconductor layer 34 having a relatively great or large area, is first formed and then only a narrow area corresponding to the first conductive semiconductor layer 32 is removed from the second doping layer 342, the entire process time may be reduced. However, the embodiments of the invention are not limited thereto and the second doping layer 342 may be formed on the semiconductor layer 30 into a shape corresponding to the second conductive semiconductor layer 34 using a mask. Alternatively, the first doping layer 322 may first be formed and then the second doping layer 342 may be formed. Various other alterations are possible.

Figure 3G:
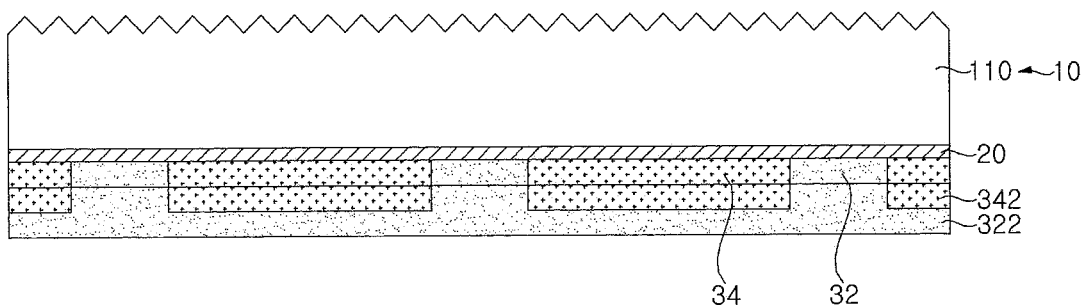

Next, as shown by example in FIG. 3G, through thermal treatment, the first conductive dopant contained in the first doping layer 322 is diffused into the semiconductor layer (see reference numeral 30 of FIG. 3F) to form the first conductive semiconductor layer 32 and the second conductive dopant contained in the second doping layer 342 is diffused into the semiconductor layer 30 to form the second conductive semiconductor layer 34. Although the embodiment of the invention illustrates doping of the first and second conductive dopants using the first and second doping layers 322 and 324, the embodiments of the invention are not limited thereto. Thus, various alterations, such as, for example, ion implantation using a mask, are possible.

Figure 3H:
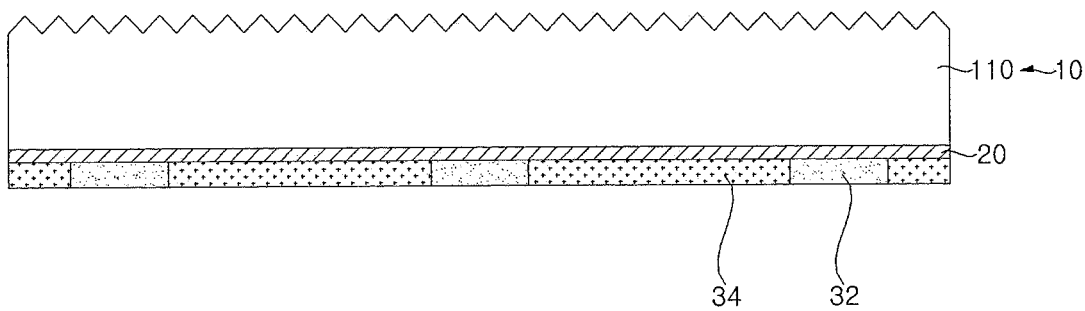

Next, as shown by example in FIG. 3H, the first doping layer 322 and the second doping layer 324 are removed. Various known methods may be used to remove the doping layers. In one example, the first doping layer 322 and the second doping layer 324 may be removed by sequentially being dipped in dilute hydrofluoric (HF) acid solution and then being washed using water. However, the embodiments of the invention are not limited thereto. This removal of the first and second doping layers 322 and 342 may prevent bending that may occur when the doping layers 322 and 342 remain.

Figure 3I:
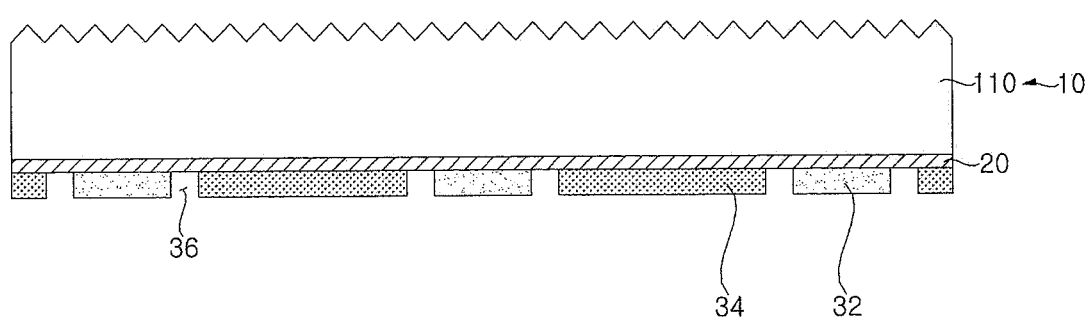

Next, as shown by example in FIG. 3I, at least one of the first and second conductive semiconductor layers 32 and 34 is etched at the boundary between the first and second conductive semiconductor layers 32 and 34 to form the trench 36 between the first and second conductive semiconductor layers 32 and 34. In this instance, only the first and second conductive semiconductor layers 32 and 34 are selectively removed without removal of the tunneling layer 20 and the semiconductor substrate 10.

Various methods may be used to selectively remove only the first and second conductive semiconductor layers 32 and 34.

In one example, laser ablation may be implemented under the condition that the kind of laser, the magnitude of power and the like are regulated such that only the first and second conductive semiconductor layers 32 and 34 are etched. For example, only the first and second conductive semiconductor layers 32 and 34 may be selectively removed by controlling the temperatures of the first and second conductive semiconductor layers 32 and 34 heated by the laser ablation, the kind of laser, the output power and the like.

In another example, only the first and second conductive semiconductor layers 32 and 34 may be selectively removed by etching using an etching solution that exhibits different etch rates with respect to the tunneling layer 20 and the first and second conductive semiconductor layers 32 and 34. More specifically, when the etching solution, paste or the like, which serves to etch only the first and second conductive semiconductor layers 32 and 34 without etching the tunneling layer 20 and the semiconductor substrate 10, is applied to the boundary between the first and second conductive semiconductor layers 32 and 34 to be removed, only the first and second conductive semiconductor layers 32 and 34 are selectively etched and the tunneling layer 20 and the semiconductor substrate 10 are not etched. In this instance, as occasion demands, a mask, a resist layer or the like, which exposes only the boundary between the first and second conductive semiconductor layers 32 and 34, may be used.

More specifically, when the tunneling layer 20 contains silicon oxide and the first and second conductive semiconductor layers 32 and 34 contain silicon, the etching solution may include tetra-methyl ammonium hydroxide (TMAH). Tetra-methyl ammonium hydroxide exhibits different etch rates with respect to silicon oxide and silicon and, thus, may effectively etch the first and second conductive semiconductor layers 32 and 34 containing silicon without damage to the tunneling layer 20 containing silicon oxide. This will be described below in more detail with reference to FIGS. 4 and 5.

Figure 4:
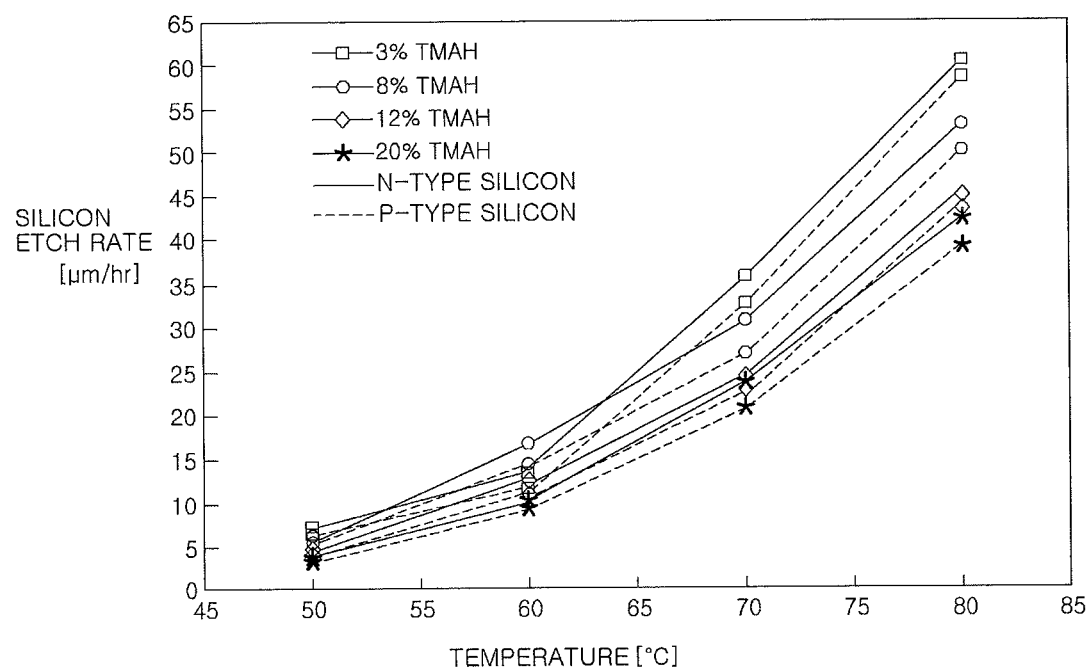
FIG. 4 is a graph showing an etch rate of silicon using tetra-methyl ammonium hydroxide (TMAH) depending on temperature and density.
Figure 5:
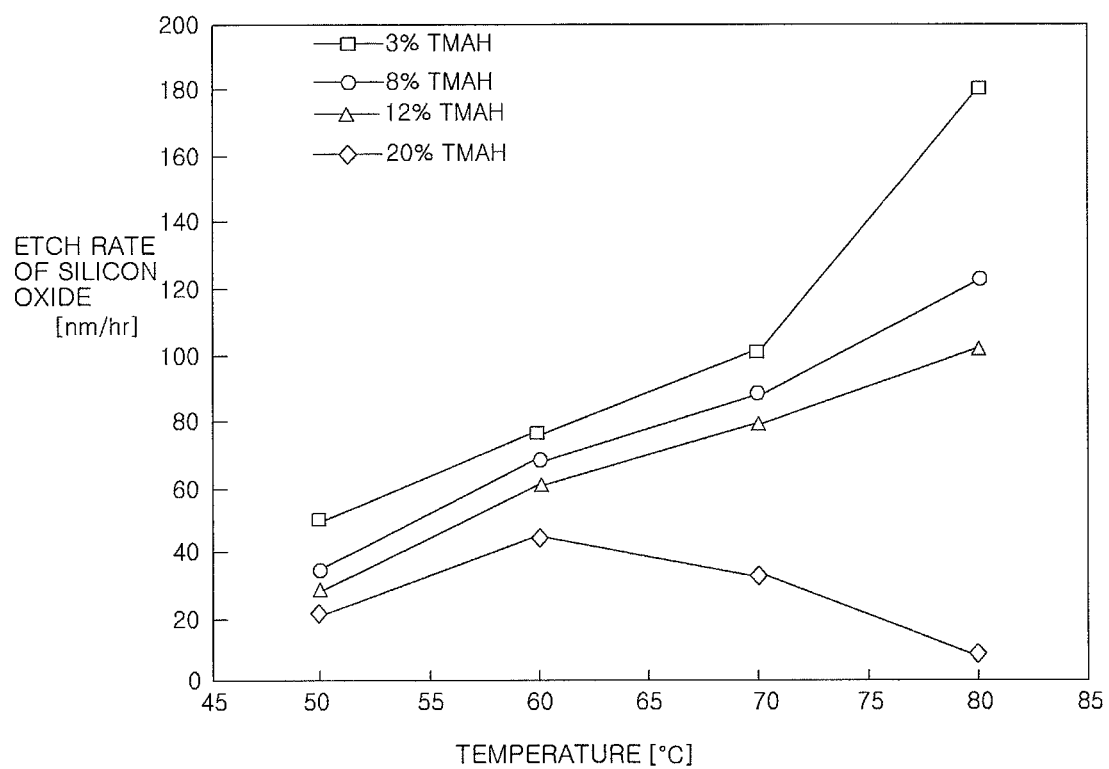
FIG. 5 is a graph showing an etch rate of silicon oxide using tetra-methyl ammonium hydroxide depending on temperature and density.

FIG. 4 is a graph showing an etch rate of silicon using tetra-methyl ammonium hydroxide (TMAH) depending on temperature and density and FIG. 5 is a graph showing an etch rate of silicon oxide using tetra-methyl ammonium hydroxide (TMAH) depending on temperature and density. It will be appreciated with reference to FIGS. 4 and 5 that a silicon etch rate of TMAH is within a range of 5 μm to 60 μm, whereas a silicon oxide etch rate of TMAH is within a range of 2 nm to 180 nm. That is, it will be appreciated that TMAH exhibits a high silicon etch rate and a low silicon oxide etch rate and, thus, may serve to selectively etch silicon.

Although the embodiment of the invention describes the use of TMAH as the etching solution by way of example, the embodiments of the invention are not limited thereto. Accordingly, in consideration of constituent materials and the like of the semiconductor substrate 10, the tunneling layer 20 and the first and second conductive semiconductor layers 32 and 34, various other materials capable of selectively etching the first and second conductive semiconductor layers 32 and 34 may be used.

In addition, the embodiment of the invention describes that the first conductive semiconductor layer 32 and the second conductive semiconductor layer 34 are formed to come into contact with each other and the boundary therebetween is removed. However, the embodiments of the invention are not limited thereto. Thus, the first conductive semiconductor layer 32 and the second conductive semiconductor layer 34 may be formed so as to be spaced apart from each other (for example, with a separation portion in the form of an intrinsic semiconductor layer interposed therebetween (see reference numeral 36c of FIG. 8)) and then at least the separation portion 36c may be removed. Various other alterations are possible.

Figure 3J:
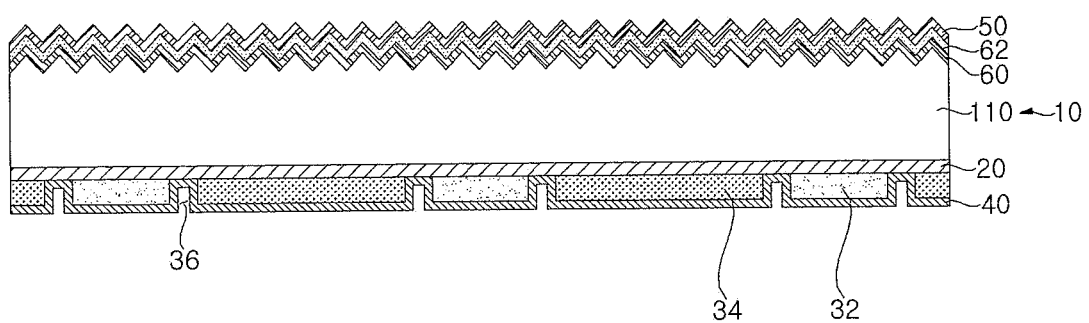

Next, as shown by example in FIG. 3J, the insulation layer 40 is formed over the first and second conductive semiconductor layers 32 and 34 at the back surface of the semiconductor substrate 10. In addition, the passivation film 60, the front surface field layer 62 and the anti-reflection film 50 are formed at the front surface of the semiconductor substrate 10. The insulation layer 40 and the passivation layer 60 may be formed by various methods, such as vacuum deposition, chemical vapor deposition, spin coating, screen-printing, spray coating or the like. The front surface field layer 62 may be formed by doping a first conductive dopant during or after deposition of a semiconductor material or the like. The anti-reflection film 50 may be formed by various methods, such as vacuum deposition, chemical vapor deposition, spin coating, screen-printing, spray coating or the like.

Figure 3K:
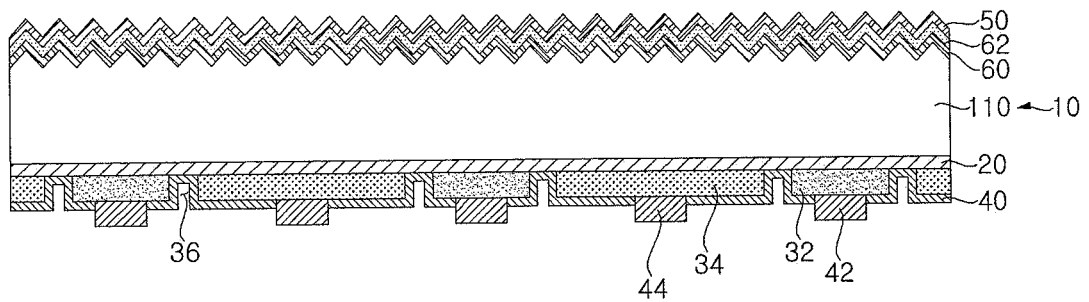

Next, as shown by example in FIG. 3K, the first and second electrodes 42 and 44 are formed on the first and second conductive semiconductor layers 32 and 34 so as to be electrically connected thereto.

The first and second electrodes 42 and 44 may be formed by forming an opening in the insulation layer 40 and implementing various methods, such as plating, deposition or the like. Alternatively, after a paste for formation of the first and second electrodes 42 and 44 is applied to the insulation layer 40 by screen-printing or the like, the first and second electrodes 42 and 44 having the above-described shapes may be formed via a fire-through, a laser firing contact or the like. In this instance, addition of a process to form the opening is unnecessary.

The above-described embodiment illustrates that the tunneling layer 20, the first and second conductive semiconductor layers 32 and 34, the trench 36 and the insulation layer 40 are first formed and then the front surface field layer 62 and the anti-reflection film 50 are formed and, thereafter, the first and second electrodes 42 and 44 are formed. However, the embodiments of the invention are not limited thereto. Accordingly, the formation sequence of the tunneling layer 20, the first and second conductive semiconductor layers 32 and 34, the trench 36, the insulation layer 40, the front surface field layer 62, the anti-reflection film 50 and the first and second electrodes 42 and 44 may be altered in various ways.

According to the embodiment of the invention, upon formation of the trench 36, the trench 36 is not formed in the semiconductor substrate 10 and the tunneling layer 20. This may prevent damage to the semiconductor substrate 10 and the tunneling layer 20 and eliminate a need to additionally form a passivation film for passivation of the semiconductor substrate 10 and the tunneling layer 20 at a location corresponding to the trench 36. In this way, properties of the solar cell 100, such as the efficiency of the solar cell 100, may be enhanced and a manufacturing method of the solar cell 100 may be simplified.

Hereinafter, the solar cell according to other embodiments of the invention will be described in more detail with reference to FIGS. 6 to 8 and FIGS. 9A to 9F.

Figure 6:
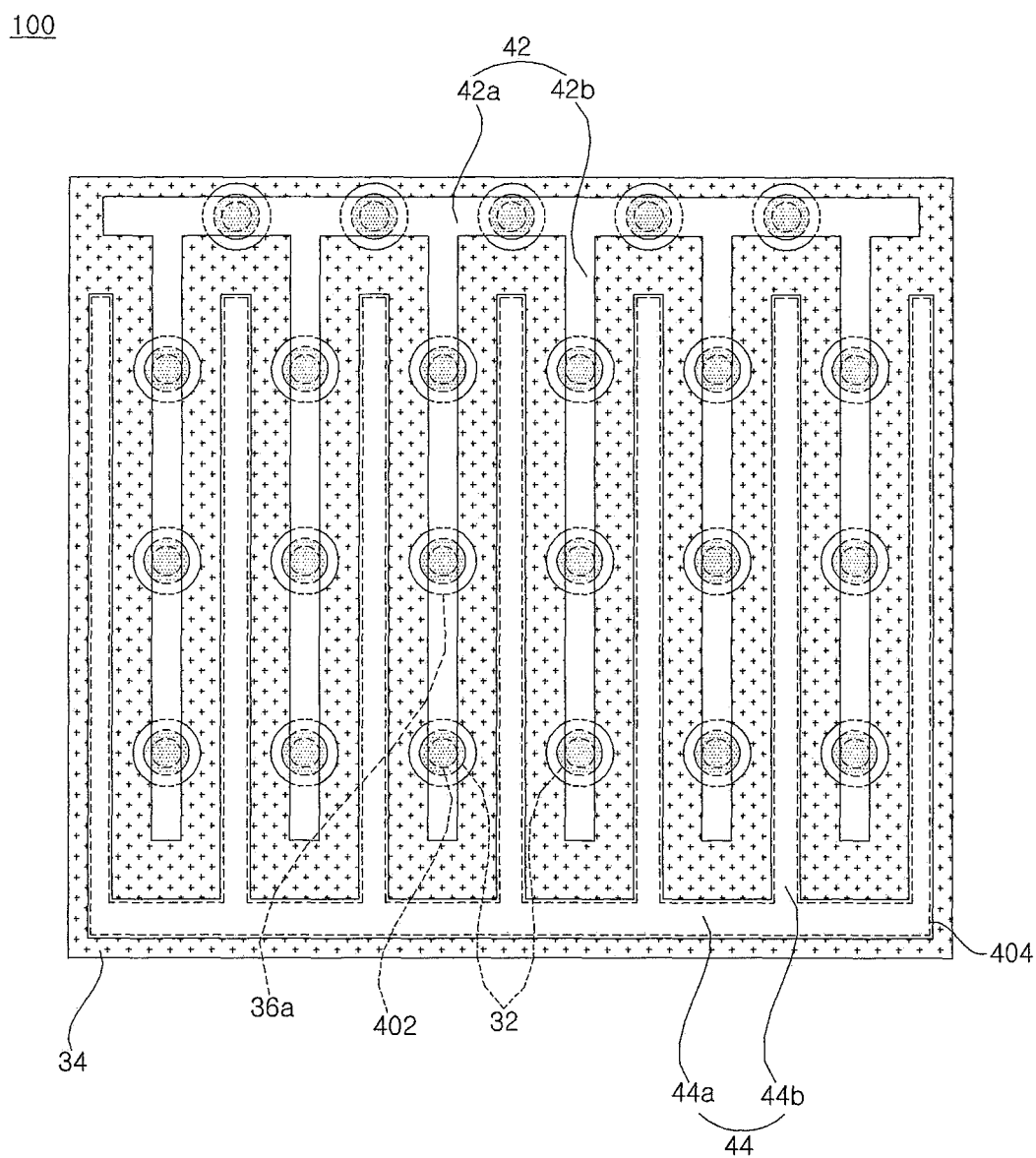
FIG. 6 is a rear plan view showing a solar cell according to another embodiment of the invention.

FIG. 6 is a rear plan view showing the solar cell according to another embodiment of the invention. For clear and brief illustration, in FIG. 6, the insulation layer (see reference numeral 40 of FIG. 1) is not shown and only openings 402 and 404 formed in the insulation layer 40 are shown.

Referring to FIG. 6, in the solar cell 100 according to the embodiment of the invention, a plurality of first conductive semiconductor layers 32 in the form of islands may be spaced apart from one another. This configuration may minimize an area of the first conductive semiconductor layers 32 and allow the first conductive semiconductor layers 32 to be distributed over the entire semiconductor substrate 10. As such, surface recombination due to the first conductive semiconductor layers 32 may be effectively prevented and an area of the second conductive semiconductor layer 34 may be maximized. However, the embodiments of the invention are not limited thereto and the first conductive semiconductor layers 32 may have various other shapes to minimize an area thereof.

In addition, although the drawing illustrates the first conductive semiconductor layers 32 as having a circular shape, the embodiments of the invention are not limited thereto. Thus, the first conductive semiconductor layers 32 may have a polygonal planar shape, such as oval, triangular, rectangular, hexagonal shapes, etc.

In addition, each first conductive semiconductor layer 32 may be surrounded by a trench 36a. In one example, when the first conductive semiconductor layer 32 has a circular shape, the trench 36a may have an annular shape or a ring shape. That is, the trench 36a may be formed to surround the first conductive semiconductor layer 32 and serve to prevent generation of an unnecessary shunt by causing the first conductive semiconductor layer 32 and the second conductive semiconductor layer 34 to be spaced apart from each other. The drawing illustrates that the trench 36a surrounds the entire first conductive semiconductor layer 32 to fundamentally prevent generation of the shunt. However, the embodiments of the invention are not limited thereto and the trench 36a may surround only a portion of the periphery of the first conductive semiconductor layer 32.

In this instance, the trench 36a serves as a spacer between the first conductive semiconductor layer 32 and the second conductive semiconductor layer 34 and, therefore, may have a minimum width required to cause the first conductive semiconductor layer 32 and the second conductive semiconductor layer 34 to be spaced apart from each other. That is, the trench 36a may have a smaller width than a width of the first conductive semiconductor layer 32 that has a relatively small area. In this instance, a width of the first conductive semiconductor layer 32 may be changed according to the shape of the first conductive semiconductor layer 32. The shape of the first conductive semiconductor layer 32 may be defined based on a diameter when the first conductive semiconductor layer 32 has a circular shape as described above, and may be defined based on a major width when the first conductive semiconductor layer 32 has a polygonal shape. The first conductive semiconductor layer 32 having a minimum area may prevent unnecessary local heat emission from the first conductive semiconductor layer 32 and the second conductive semiconductor layer 34.

Figure 7:
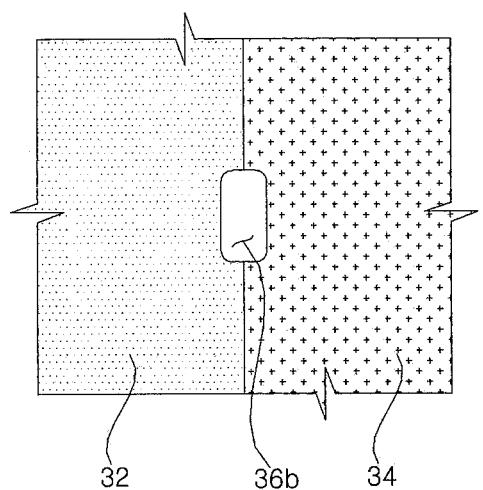
FIG. 7 is a partial plan view showing first and second conductive semiconductor layers and a trench of the solar cell according to another embodiment of the invention.

FIG. 7 is a partial plan view showing the first and second conductive semiconductor layers and the trench of the solar cell according to another embodiment of the invention.

Referring to FIG. 7, in the embodiment of the invention, a trench 36b serving as the separation portion is partially formed in the boundary between the first and second conductive semiconductor layers 32 and 34. Although the trench 36b is not formed throughout the boundary, the trench 36b may serve to sufficiently prevent local heat emission and the like. In addition, the partially formed trench 36b may maximize an area of the first and second conductive semiconductor layers 32 and 34. In this instance, the first and second conductive semiconductor layers 32 and 34 may have the shape as shown by example in FIGS. 2 to 6. Alternatively, the first and second conductive semiconductor layers 32 and 34 may have various other shapes.

There may be various examples of the partially formed trench 36b in terms of the length, distance, arrangement and the like, and various other alterations are also possible.

Figure 8:
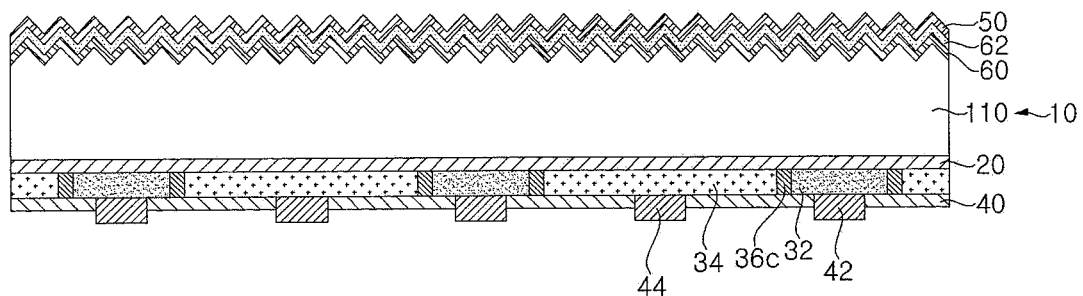
FIG. 8 is a sectional view showing a solar cell according to another embodiment of the invention.

FIG. 8 is a sectional view showing a solar cell according to another embodiment of the invention.

Referring to FIG. 8, in the embodiment of the invention, the separation portion 36c, which separates the first and second conductive semiconductor layers 32 and 34 from each other, may be entirely filled with an intrinsic semiconductor layer. That is, the intrinsic semiconductor layer may be located in the separation portion 36c at the boundary between the first and second conductive semiconductor layers 32 and 34 and configure a spacer by which the first and second conductive semiconductor layers 32 and 34 do not come into contact with each other. In this instance, the separation portion 36c may be partially formed between the first and second conductive semiconductor layers 32 and 34 as shown by example in FIG. 7. This may maximize an area of the first and second conductive semiconductor layers 32 and 34, thereby contributing to enhancement in the efficiency of the solar cell 100. However, the embodiments of the invention are not limited thereto and the separation portion 36c may have a structure as shown by example in FIG. 2.

In this instance, in the embodiment of the invention, the first and second conductive semiconductor layers 32 and 34 and the separation portion 36c are simultaneously formed by the same process, which may simplify a manufacturing process of the solar cell 100 and, consequently, provide an improved configuration of the solar cell 100. This will be described below in more detail with reference to FIGS. 9A to 9F. Hereinafter, the same parts as those already described above with reference to FIGS. 3A to 3K will not be repeated and only parts different from those already described will be provided in detail.

FIGS. 9A to 9F are sectional views showing a method for manufacturing the solar cell according to the embodiment of the invention.

Figure 9A:
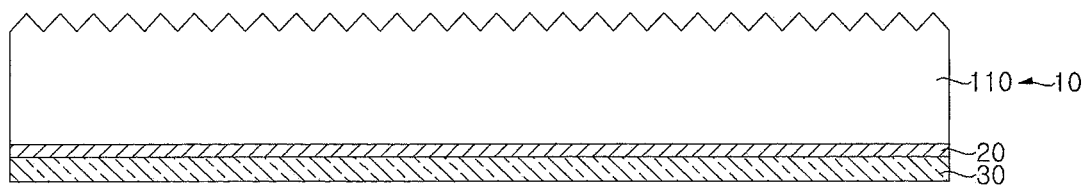
FIGS. 9A to 9F are sectional views showing a method for manufacturing the solar cell according to the embodiment of the invention.

First, as shown by example in FIG. 9A, the tunneling layer 20 and the semiconductor layer 30 are formed on the semiconductor substrate 10 in sequence. The semiconductor layer 30 may be formed of a poly-crystal, fine-crystal or amorphous semiconductor (for example, silicon).

Next, as shown by example in FIGS. 9B to 9E, the first conductive semiconductor layers 32, the second conductive semiconductor layers 34 and the separation portions 36c are formed on the semiconductor layer 30. This will be described below in more detail.

Figure 9B:
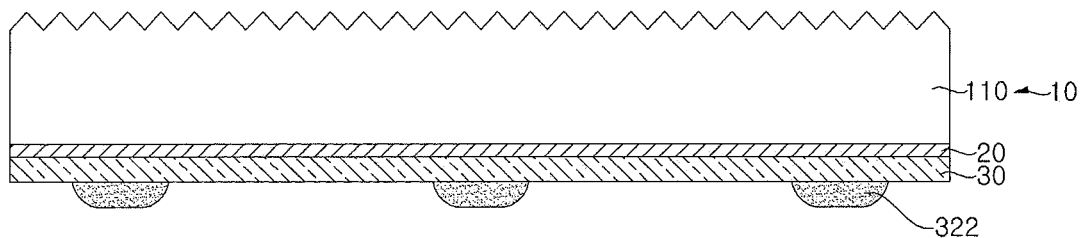

More specifically, as shown by example in FIG. 9B, the first doping layer 322 is formed at positions corresponding to the first conductive semiconductor layers 32. The first doping layer 322 may be any one of various layers containing a first conductive dopant and, for example, may be formed of phosphorous silicate glass (PSG). Through use of phosphorous silicate glass (PSG), the first doping layer 322 may be easily formed. In this instance, the first doping layer 322 may include a plurality of doping portions corresponding to the plural first conductive doping layers 32. The plural doping portions may have an island shape corresponding to the first conductive semiconductor layers 32.

The first doping layer 322 as described above may be formed on the semiconductor layer 30 into a shape corresponding to the first conductive semiconductor layers 32 using a mask. Alternatively, the first doping layers 322 having a shape corresponding to the first conductive semiconductor layers 32 may be formed on the semiconductor layer 30 by an inkjet printing or a screen-printing, for example. Alternatively, to form the first doping layer 322, a material corresponding to the first doping layer 322 may be disposed on the entire semiconductor layer 30 and a portion of the material at which the first conductive semiconductor layers 32 will not be formed may be removed using an etching solution, etching paste or the like.

Figure 9C:
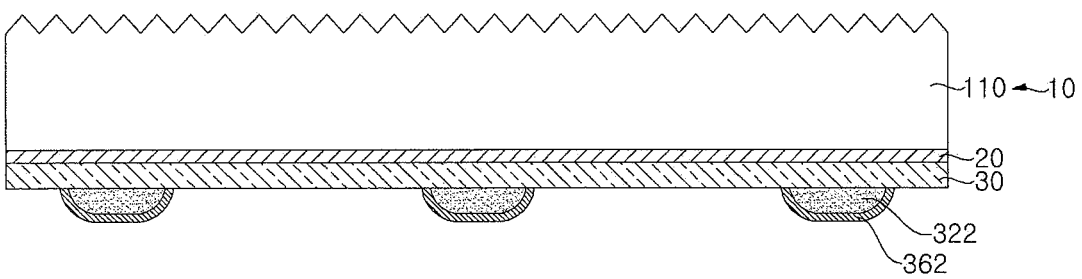

Next, as shown by example in FIG. 9C, an undoped layer 362 is formed to cover the first doping layer 322 and a portion of the semiconductor layer 30 around the first doping layer 322. The undoped layer 362 is formed of a material not containing first and second conductive dopants. In one example, the undoped layer 362 may be a silicate or insulation film. In this instance, the undoped layer 362 may cover the first doping layer 322 and a portion of the semiconductor layer 30 around the first doping layer 322.

The undoped layer 362 may be formed on the semiconductor layer 30 into a desired shape using a mask. Alternatively, the undoped layer 362 having a desired shape may be formed on the semiconductor layer 30 by the inkjet printing or the screen-printing, for example. Alternatively, to form the undoped layer 362, a material corresponding to the undoped layer 362 may be disposed on the entire semiconductor layer 30 and the first doping layer 322 and an unnecessary portion of the material may be removed using an etching solution, etching paste or the like.

Figure 9D:
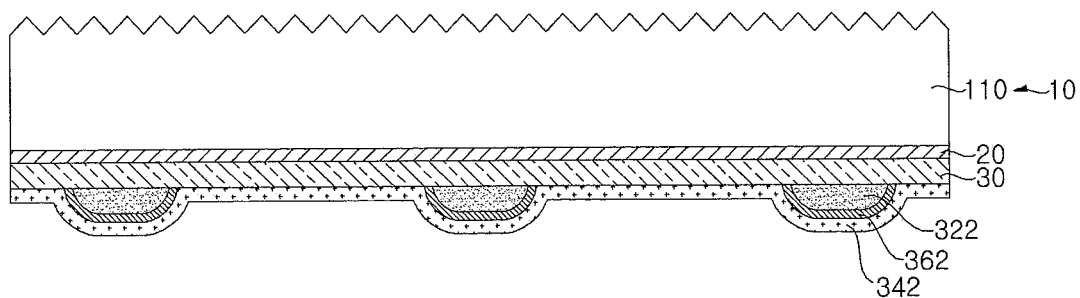

Next, as shown by example in FIG. 9D, the second doping layer 342 is formed on the undoped layer 362 and the semiconductor layer 30. The second doping layer 342 may be any one of various layers containing a second conductive dopant. The second doping layer 342 may be easily formed using boron silicate glass. The second doping layer 342 may be formed to wholly cover the undoped layer 362 and the semiconductor layer 30.

Figure 9E:
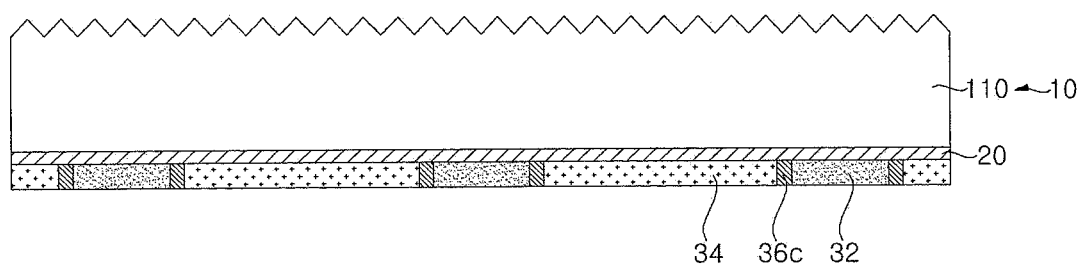

Next, as shown by example in FIG. 9E, through thermal treatment, the first conductive dopant contained in the first doping layer 322 is diffused into the semiconductor layer 30 to form the first conductive semiconductor layer 32 and the second conductive dopant contained in the second doping layer 342 is diffused into the semiconductor layer 30 to form the second conductive semiconductor layer 34. A portion of the semiconductor layer 30 adjacent to the undoped layer 362, which will be located between the first conductive semiconductor layer 32 and the second conductive semiconductor layer 34, is not doped to form the separation portion 36c. In this instance, the separation portion 36c may be formed of a poly-crystal, fine-crystal or amorphous semiconductor (for example, silicon).

As such, the first conductive semiconductor layer and the second conductive semiconductor layer 34 are spaced apart from each other by the separation portion 36c located between the first conductive semiconductor layer 32 and the second conductive semiconductor layer 34.

Then, the first doping layer 322, the undoped layer 362 and the second doping layer 342 are removed. Various known methods may be used to remove these layers. In one example, the first doping layer 322, the undoped layer 362 and the second doping layer 342 may be removed by sequentially being dipped in dilute hydrofluoric (HF) acid solution and then being washed using water. However, the embodiments of the invention are not limited thereto.

Figure 9F:
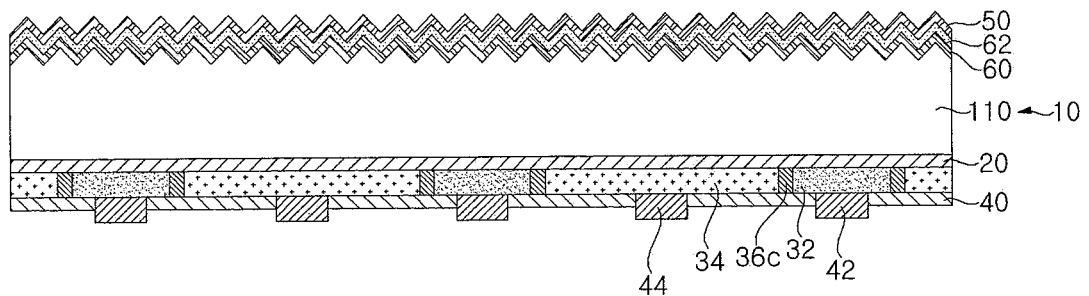

Next, as shown by example in FIG. 9F, the insulation layer 40, the passivation film 60, the front surface field layer 62, the anti-reflection film 50 and the first and second electrodes 42 and 44 are formed.

According to the embodiment of the invention, the first and second conductive semiconductor layers 32 and 34 and the separation portion 36c may be simultaneously formed through a simplified process of forming the semiconductor layer 30 and then doping a portion of the semiconductor layer 30 with a dopant, which may simplify a manufacturing method of the solar cell 100 and result in improved productivity of the solar cell 100. In particular, as the first doping layer 322 and the undoped layer 362 each having a plurality of portions are formed and the second doping layer 342 is formed on the entire surface, the first and second conductive semiconductor layers 32 and 34 and the separation portion 36c having desired shapes may be simultaneously formed by implementing a minimum number of patterning processes. This may result in remarkably enhanced productivity.

Although the above-described embodiment illustrates that the first doping layer 322, the undoped layer 362 and the second doping layer 342 are formed in sequence, the embodiments of the invention are not limited thereto. That is, after the second doping layer 342 is first formed, the undoped layer 362 and the first doping layer 322 may be formed in sequence. Alternatively, after the undoped layer 362 is formed only at a position corresponding to the separation portion 36c, the first and second doping layers 322 and 342 may be formed. Accordingly, the formation sequence of the first and second doping layers 322 and 342 and the undoped layer 362 may be altered in various ways.

Meanwhile, in the embodiment of FIG. 8, as the separation portion 36c between the first conductive semiconductor layer 32 and the second conductive semiconductor layer 34 is wholly filled with the intrinsic semiconductor layer, the first conductive semiconductor layer 32 and/or the second conductive semiconductor layer have the same thickness or similar thicknesses. However, the embodiments of the invention are not limited thereto and various alterations are possible.

Figure 10:
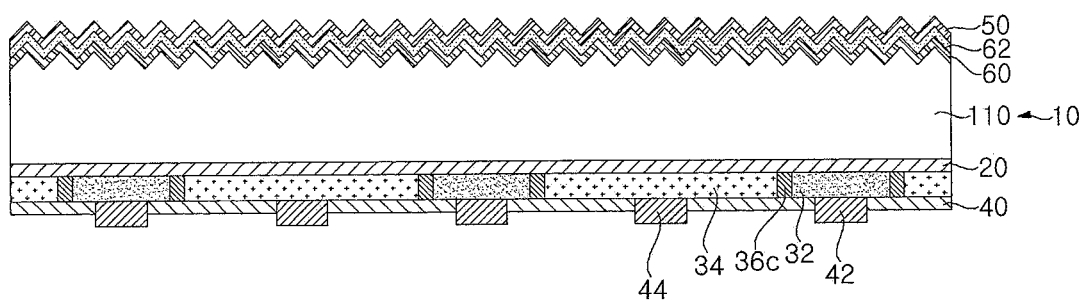
FIG. 10 is a sectional view showing a solar cell according to another embodiment of the invention.

For example, as shown by example in FIG. 10, an intrinsic semiconductor layer 36d located at the separation portion 36c may have a smaller thickness than a thickness of the first conductive semiconductor layer 32 and the second conductive semiconductor layer 34. For example, the separation portion 36c may have a thickness of 10 μm or less.

The separation portion 36c may be formed by the process as described above with reference to FIG. 3I after completion of the process of forming the first and second conductive semiconductor layers 32 and 34 (the process shown in FIG. 9C). In this instance, in the embodiment of the invention, through removal of the separation portion 36c, shunt between the first conductive semiconductor layer 32 and the second conductive semiconductor layer 34 may be effectively prevented and a portion of the separation portion 36c may remain to more stably protect the tunneling layer 20.

Figure 11:
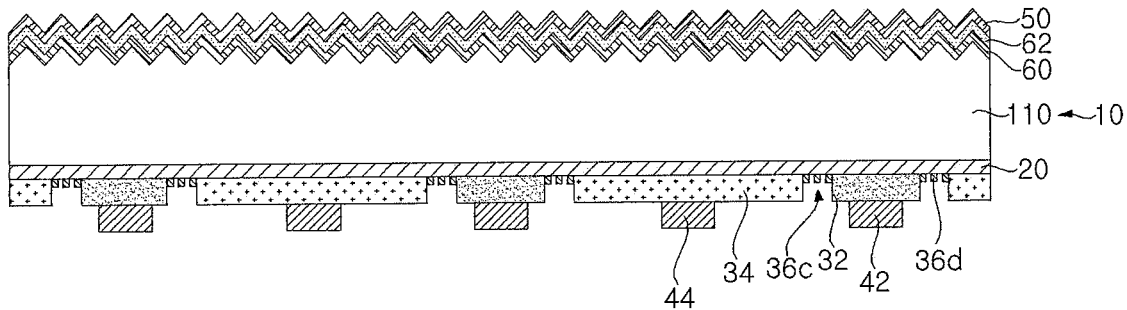
FIG. 11 is a sectional view showing a solar cell according to a further embodiment of the invention.

Although FIG. 10 shows that the separation portion 36c between the conductive semiconductor layer 32 and the second conductive semiconductor layer 34 is wholly filled with the intrinsic semiconductor layer, the embodiments of the invention are not limited thereto. That is, as shown by example in FIG. 11, the separation portion 36c between the first conductive semiconductor layer 32 and the second conductive semiconductor layer 34 may be partially filled with the intrinsic semiconductor layer 36d. In this instance, the intrinsic semiconductor layer 36d may be located only in a portion of the separation portion 36c between the conductive semiconductor layer 32 and the second conductive semiconductor layer 34 and may not be located in the remaining portion of the separation portion 36c. For example, the intrinsic semiconductor layer 36d located in the separation portion 36c may include a plurality of portions in the form of islands, or a plurality of openings spaced apart from one another may be formed in the intrinsic semiconductor layer 36d. Through provision of the intrinsic semiconductor layer 36d in a portion of the separation portion 36a, movement of carries caused by the intrinsic semiconductor layer 36d may be effectively prevented and the tunneling layer 20 may be more stably protected.

As is apparent from the above description, according to the embodiments of the invention, through provision of a separation portion between first and second conductive semiconductor layers, it is possible to prevent various problems (for example, hot spots) that may occur when the first conductive semiconductor layer and the second conductive semiconductor layer come into contact with each other. In this instance, a trench is not formed in a semiconductor substrate and a tunneling layer. As such, damage to the semiconductor substrate and the tunneling layer may be prevented and there is no need to form a passivation film at a location where the trench is formed. In this way, properties of the solar cell, such as efficiency of the solar cell, may be improved and a manufacturing method of the solar cell may be simplified.

The above described features, configurations, effects, and the like are included in at least one of the embodiments of the invention, and should not be limited to only one embodiment. In addition, the features, configurations, effects, and the like as illustrated in each embodiment may be implemented with regard to other embodiments as they are combined with one another or modified by those skilled in the art. Thus, content related to these combinations and modifications should be construed as including in the scope and spirit of the embodiments of the invention as disclosed in the accompanying claims.

What is claimed is:
1. A solar cell comprising:
a semiconductor substrate including monocrystalline silicon;
a first conductive semiconductor layer formed of a polycrystalline semiconductor and formed on one surface of the semiconductor substrate;
a second conductive semiconductor layer formed of a polycrystalline semiconductor and formed on the one surface of the semiconductor substrate;
a tunneling layer entirely formed on the one surface of the semiconductor substrate between the semiconductor substrate and the first and second conductive semiconductor layers;
a separation portion to separate the first and second conductive semiconductor layers from each other, and formed on a surface of the tunneling layer at a location corresponding to at least a portion of a boundary between the first and second conductive semiconductor layers;

a plurality of electrodes contacting with at least the first conductive semiconductor layer and the second conductive semiconductor layer, and including a first electrode and a second electrode; and an insulation layer formed on the first and second conductive semiconductor layers, wherein the separation portion includes a trench in the form of an empty space, wherein the trench includes a plurality of first trench portions extending in a first direction, a plurality of second trench portions connecting first ends of the plurality of first trench portions, and a plurality of third trench portions connecting second ends opposite to the first ends of the plurality of first trench portions, and wherein a shape of the plurality of second trench portions is semi-circular and a shape of the plurality of third trench portions is a straight line extending in a second direction between two curved portions, wherein the separation portion of the empty space has a width less than each of a width of the first conductive semiconductor layer and a width of the second conductive semiconductor layer, wherein insulation layer is disposed on both lateral surfaces and a bottom surface of the trench, and portions of the insulation layer disposed on both the lateral surfaces are apart from each other, wherein the width of the first conductive semiconductor layer is greater than the width of ti second conductive semiconductor layer, wherein a width of each electrode is greater than the width of the separation portion, and wherein the width of each electrode is less than the width of the second conductive semiconductor layer.

2. The solar cell according to claim 1, wherein the separation portion is partially formed between the first conductive semiconductor layer and the second conductive semiconductor layer when viewed in plane.

3. The solar cell according to claim 1, wherein the separation portion is wholly formed between the first conductive semiconductor layer and the second conductive semiconductor layer when viewed in plane.

4. The solar cell according to claim 1, wherein the trench is a continuously formed single trench.

5. The solar cell according to claim 4, wherein the first conductive semiconductor layer includes a plurality of first branch portions arranged in parallel to one another, wherein the second conductive semiconductor layer includes a plurality of second branch portions arranged in parallel to one another, and wherein the plurality of first trench portions are formed between the first branch portions and the second branch portions, the plurality of first trench portions having an elongated shape and extending in a longitudinal direction of the first and second branch portions, and the plurality of second trench portions each alternately interconnect two neighboring first trench portions among the plural first trench portions.

6. The solar cell according to claim 1, wherein portions of the insulation layer contact the tunneling layer.

7. The solar cell according to claim 1, wherein the insulation layer does not overlap with each electrode in a direction normal to the one surface of the semiconductor substrate.

8. The solar cell according to claim 1, wherein a width of an opening of the insulation layer is the same with a width of each electrode.

9. The solar cell according to claim 1, wherein each electrode is thicker than the insulation layer.

10. The solar cell according to claim 1, wherein the insulation layer has a uniform thickness.

11. The solar cell according to claim 1, wherein the trench is serpentine between interdigitated first and second conductive semiconductor layers.

* * * * *